United States Patent
Wang et al.

(10) Patent No.: US 12,480,223 B2
(45) Date of Patent: Nov. 25, 2025

(54) APPARATUS AND METHOD FOR USE WITH A SUBSTRATE CHAMBER

(71) Applicant: Taiwan Semiconductor Manufacturing Co., Ltd., Hsinchu (TW)

(72) Inventors: Li-Ting Wang, Hsinchu (TW); Jung-Jen Chen, Hsinchu (TW); Ming-Hua Yu, Hsinchu (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 51 days.

(21) Appl. No.: 17/377,581

(22) Filed: Jul. 16, 2021

(65) Prior Publication Data

US 2023/0017768 A1      Jan. 19, 2023

(51) Int. Cl.
   *C30B 25/10*     (2006.01)
   *C30B 25/16*     (2006.01)

(52) U.S. Cl.
   CPC ............ *C30B 25/165* (2013.01); *C30B 25/10* (2013.01)

(58) Field of Classification Search
   CPC ....... C23C 16/482; C23C 16/52; C30B 25/10; C30B 25/16; C30B 25/165
   See application file for complete search history.

(56) References Cited

U.S. PATENT DOCUMENTS

| | | | | |
|---|---|---|---|---|
| 5,258,824 | A * | 11/1993 | Carlson ................. | G01B 15/02 250/339.04 |
| 6,301,434 | B1 * | 10/2001 | McDiarmid .......... | C23C 16/488 219/390 |
| 6,476,362 | B1 * | 11/2002 | Deacon ................ | H05B 3/0047 118/724 |
| 2002/0023590 | A1 * | 2/2002 | Storbeck ........... | H01L 21/68735 118/725 |
| 2007/0012241 | A1 * | 1/2007 | Blomiley .............. | C30B 25/165 117/89 |
| 2007/0238202 | A1 * | 10/2007 | Ranish .................... | H01L 22/12 257/E21.53 |
| 2009/0175605 | A1 * | 7/2009 | Kobayashi ........ | H01L 21/67115 392/416 |
| 2010/0143579 | A1 * | 6/2010 | Narahara .......... | H01L 21/67248 118/724 |

(Continued)

*Primary Examiner* — Matthew J Song
(74) *Attorney, Agent, or Firm* — Slater Matsil, LLP

(57) ABSTRACT

In an embodiment, an apparatus includes a first pyrometer and a second pyrometer configured to monitor thermal radiation from a first point and a second point on a backside of a wafer, respectively, a first heating source in a first region and a second heating source in a second region of an epitaxial growth chamber, respectively, where a first controller adjusts an output of the first heating source and the second heating source based upon the monitored thermal radiation from the first point and the second point, respectively, a third pyrometer and a fourth pyrometer configured to monitor thermal radiation from a third point and a fourth point on a frontside of the wafer, respectively, where a second controller adjusts a flow rate of one or more precursors injected into the epitaxial growth chamber based upon the monitored thermal radiation from the first, second, third, and fourth points.

20 Claims, 4 Drawing Sheets

(56) References Cited

U.S. PATENT DOCUMENTS

2011/0155058 A1* 6/2011 Carlson ............ H01L 21/67115
  118/728
2017/0125308 A1  5/2017 Hung
2017/0309529 A1* 10/2017 Aderhold ................ H01L 22/26
2019/0371631 A1* 12/2019 Lau ...................... B23K 26/073

* cited by examiner

APPARATUS AND METHOD FOR USE WITH A SUBSTRATE CHAMBER

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies.

The reduction in feature size in semiconductor devices has increased the need for precise processing. One aspect subject to precise processing is uniformity within a film. As a film is grown on a wafer, the uniformity in thickness of the film from a center of the wafer to an edge of the wafer generally depends heavily on the uniformity of temperature applied across the film. Temperature uniformity and thickness uniformity across the film may be achieved by measuring temperatures of the film on a front side of the wafer and measuring temperatures on a surface of a backside of the wafer and controlling the applied temperature according to the measurements. Pyrometers are often used to measure temperatures of films and wafer surfaces in a semiconductor processing chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
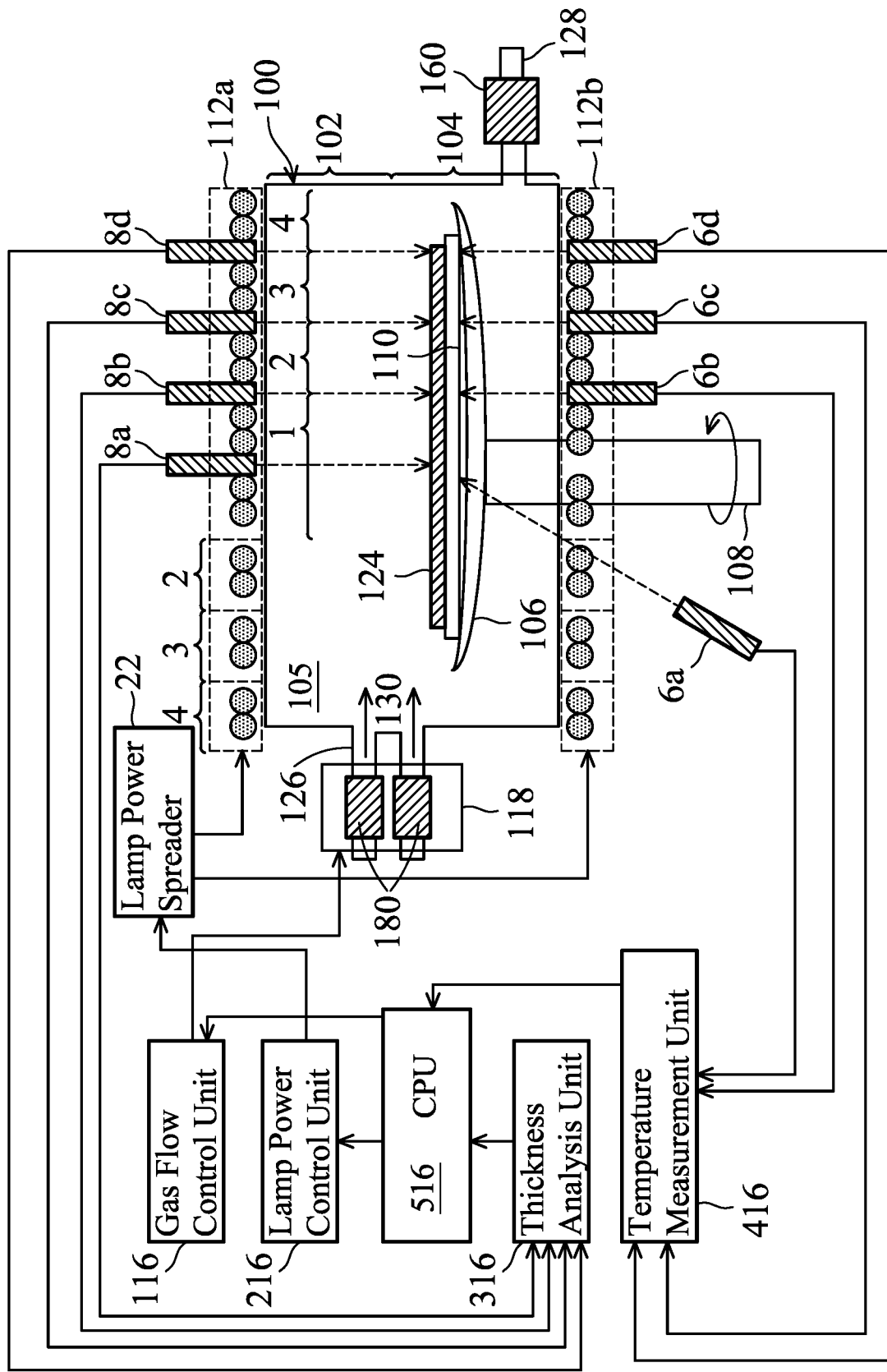
FIG. 1A illustrates a cross-sectional view of an epitaxial growth chamber in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved apparatuses for controlling of temperature during an epitaxial growth process. The embodiments of the present disclosure are discussed in the context of providing various configurations of an epitaxial growth chamber used to grow an epitaxial film on a wafer. In embodiments, the growth chamber includes heating sources (e.g., lamps or lamp banks) in each zone of the growth chamber, and a series of pyrometers (e.g., frontside pyrometers and backside pyrometers) located at different points in the different zones of the growth chamber to measure the thermal radiation emitted from the film on a frontside of the wafer, and the thermal radiation emitted from a backside surface of the wafer. The frontside and backside pyrometers may take measurements from a center of the wafer to an edge of the wafer. Each backside pyrometer below the wafer takes a measurement at a point on the backside surface of the wafer. By combining the measured thermal radiation values of the backside pyrometers, the real-time temperature distribution of the backside surface of the wafer from a center of the wafer to an edge of the wafer can be estimated. Each backside pyrometer has a corresponding frontside pyrometer that takes a measurement of the film on the frontside of the wafer at a point aligned to be vertically above the point at which the backside pyrometer took the measurement on the backside surface of the wafer. By combining the measured thermal radiation values of each frontside pyrometer and its corresponding backside pyrometer, an algorithm program can estimate the in-situ, real-time thickness of the film being grown at the point on the frontside of the wafer that is being measured. During the epitaxial growth process, the power of the heating sources (e.g., lamps or lamp banks) in each zone of the growth chamber can be modulated by using a feedback control system that can respond to the in-situ temperature measurements of the backside pyrometer in that zone. During the epitaxial growth process, the flow of process gases into the growth chamber may be modulated by using a feedback control system that can respond to the in-situ temperature and film thickness measurements of the frontside pyrometers and the backside pyrometers in different zones. The embodiments of the present disclosure describe a configuration that allows for in-situ, real-time monitoring of the thickness of an epitaxial film being grown on a frontside of a wafer, across the whole film from a center of the wafer to an edge of the wafer. The embodiments of the present disclosure also describe a configuration that allows for in-situ, real-time monitoring of the temperature distribution of a backside surface of the wafer, from the center of the wafer to the edge of the wafer. In addition, the embodiments of this disclosure allow for an improved temperature uniformity and thickness uniformity across the grown film. Further, the embodiments of this disclosure allow for an ability to use a feedback control system utilizing in-situ measurements of the thickness of the epitaxial film being grown on a frontside of a wafer and in-situ measurements of temperature of a backside surface of the wafer in each zone to modulate the power of the heating sources in the zone and the amount of the various process gases flowing into the growth chamber.

Referring to FIG. 1A, a schematic view, with a portion shown in cross section, of a substrate processing chamber 100, such as an epitaxial growth (epi) chamber, and its temperature measurement apparatus are illustrated in accordance with an embodiment. It should be noted that FIG. 1A only illustrates a simplified construction of the substrate processing chamber or epitaxial growth chamber 100 because the inventive aspects of the various embodiments are independent from the structure or the system configuration of the epitaxial growth chamber 100. The epitaxial growth chamber 100 illustrated herein is limited solely for the purpose of clearly illustrating the inventive aspects of the various embodiments. The present disclosure is not limited to any particular epitaxial growth equipment.

The epitaxial growth chamber 100 comprises an upper portion 102 and a lower portion 104. The upper portion 102 and the lower portion 104 are connected to form an inner chamber 105. A susceptor 106, or other type of processing surface, may be positioned within the inner chamber 105 of the epitaxial growth chamber 100 and connected to a rotating shaft 108. The rotating shaft 108 is connected to a drive mechanism (not shown) that is operable to rotate or spin the rotating shaft 108. The rotating shaft 108, thus, causes the susceptor 106 to rotate or spin within the inner chamber 105 during the epitaxial growth process.

Prior to the epitaxial growth process, and as illustrated in FIG. 1A, a wafer 110, such as a silicon wafer, will be placed on the susceptor 106. A layer or a film 124, such as an epitaxial film (epi), will be subsequently grown, formed or deposited on top of the wafer 110. The susceptor 106, in some aspects, provides mechanical support for the wafer 110. In yet some aspects, the susceptor 106 helps to protect the backside of the wafer 110 and ensure uniform heating of the wafer 110. The susceptor 106 may be made of non-transparent materials such as silicon carbide, graphite with a silicon carbide coating and/or the like. In some embodiments, the susceptor 106 may be rotated during the epitaxial growth process to simultaneously rotate the wafer 110 that is supported by the susceptor 106, in order to improve and control film 124 uniformity. In other embodiments the susceptor 106 and the wafer 110 are not rotated during the epitaxial growth process.

A gas supply source 118 that contains a plurality of separately contained gases or precursors for forming the film 124 is connected to the epitaxial growth chamber 100. The gas supply source 118 includes a mixing chamber (not shown) for mixing the precursors. The mixed precursors, as introduced to the inner chamber 105, are represented by arrows 130. The gas supply source 118 is connected to the epitaxial growth chamber 100 via an inlet 126. An outlet 128 is positioned opposite the inlet 126. The mixed precursors 130 flow from the gas supply source 118 into the epitaxial growth chamber 100 via the inlet 126 and any exhaust gases are removed from the epitaxial growth chamber 100 via the outlet 128 with the use of a vacuum pump 160. In some embodiments, the epitaxial growth chamber 100 comprises a plurality of inlets 126 that are positioned in different areas of the epitaxial growth chamber 100. The gas supply source 118 may be controlled by a gas flow control unit 116, which will be discussed in more detail below. The gas supply source 118 may house various gas delivery components, such as, flow ratio controllers 180, injection valves, and mass flow verification components. In an illustrative embodiment, the mixed precursors 130 may be comprised of a number of different liquids or gases that when combined form epitaxial silicon, polycrystalline silicon (polysilicon), silicon oxides, silicon nitrides, and other types of silicon-containing films (e.g., Si, SiGe, SiC, or SiGeC, etc.) on top of the wafer 110. In one embodiment, the carrier gas may be $N_2$ or $H_2$. In one embodiment, the process gas may be $SiH_4$, DCS, $B_2H_6$, $PH_3$, HCl, or $GeH_4$.

The epitaxial growth chamber 100 further comprises a variety of heating sources 112. Heat is generally an integral component in the film 124 formation and a chamber process temperature that is in a range from about 250° C. to about 800° C. may be used to grow the film 124. The mixed precursors 130 may react in the presence of heat to form the film 124 on the wafer 110. If heat is disproportionately applied within the epitaxial growth chamber 100, then the film 124 may be formed on the wafer 110 unevenly. Uneven formation of the film 124 translates into thickness variations across the film 124. In other words, disparities in heat application can cause the film 124 to form unevenly such that different areas of the film 124 will have different thicknesses. Uneven formation of the film 124 and thickness variations within the film 124 are undesirable.

The heating sources 112 may be implemented by using resistance heaters, radio frequency inductive heaters, lamps, lamp banks and the like. In accordance with an embodiment, each heating source 112 may represent a plurality of tungsten lamps, tungsten lamp banks or high temperature arc lamps that are employed to heat elements within the epitaxial growth chamber 100. For example, the heating sources 112 may be employed to heat the susceptor 106, the wafer 110, the mixed precursors 130 or the film 124. Heating sources 112 in different zones of the epitaxial growth chamber 100 may be controlled separately from each other using a lamp power control unit 216, the process of which will be described in more detail below.

FIG. 1A shows fourteen heating sources 112. However, it will be appreciated by one of skill in the art that there may be fewer than or greater than fourteen heating sources 112. In an illustrative embodiment, the heating sources 112 of the epitaxial growth chamber 100 may be implemented by using the fourteen heating sources 112 (e.g., each heating source comprising a plurality of lamps or lamp banks), namely seven upper heating sources 112a positioned above the susceptor 106 and the upper portion 102 and seven lower heating sources 112b positioned below the susceptor 106 and the lower portion 104. In other embodiments, any number of upper heating sources 112a may be positioned above the susceptor 106 and any number of lower heating sources 112b may be positioned below the susceptor 106. In yet some embodiments, any number of the heating sources 112 may be positioned only below the susceptor 106 or only above the susceptor 106. Each heating source 112 (e.g., a plurality of lamps or lamp banks) may be responsible for heating a designated zone or area inside the epitaxial growth chamber 100. Furthermore, designated zones or areas corresponding to each heating source 112 may be separately controllable.

In FIG. 1A, each upper heating source 112a and a corresponding lower heating source 112b located vertically below the upper heating source 112a are responsible for heating a designated zone (e.g., heating zone 1, heating zone 2, heating zone 3, or heating zone 4 shown also in FIGS. 1B through 1C) within the inner chamber 105. FIG. 1A shows four heating zones, namely, heating zone 1, heating zone 2, heating zone 3, and heating zone 4 within the inner chamber 105 of the epitaxial growth chamber 100. In other embodiments, the epitaxial growth chamber may comprise more than four heating zones. The heating sources 112 in each heating zone (e.g., heating zone 1, heating zone 2, heating zone 3, or heating zone 4) may be controlled separately from each other using a lamp power control unit 216. Separate control of the heating sources 112 in each heating zone allows the heat distributed to the different heating zones (e.g., heating zone 1, heating zone 2, heating zone 3, or heating zone 4) to be controlled so that precise control of the film 124 process, i.e. uniform thickness of the film 124 on the wafer 110 from a center of the wafer 110 to an edge of the wafer 110, may be better achieved. In addition, during the epitaxial growth process, the power of the heating sources 112 in the heating zone 1, the heating zone 2, the heating zone 3, and the heating zone 4 of the growth chamber can be modulated (described subsequently in FIG. 2) by using a feedback control system that responds to in-situ temperature measurements of a backside pyrometer in each of the heating zone 1, the heating zone 2, the heating zone 3, and the heating zone 4 respectively.

The walls of the upper portion 102 and the walls of the lower portion 104 may be made of transparent materials such as quartz, or the like, which have a thermal emission signal that can be detected by a temperature sensor (e.g., a pyrometer). The light from the heating sources 112 may radiate through the quartz wall of the epitaxial growth chamber 100 and directly heat the wafer 110 and the susceptor 106. As a result, the top side of the wafer 110 is heated by the radiant thermal transfer from the upper heating sources 112a positioned above the wafer 110. The backside of the wafer 110 is heated by the radiant thermal transfer from the lower heating sources 112b positioned below the susceptor 106 and the conduction thermal transfer from the heated susceptor 106 which is heated by the radiant thermal transfer from the lower heating sources 112b.

In order to precisely control the temperature set points of the wafer 110 and the film 124 during an epitaxial growth process, a plurality of temperature sensors are employed to monitor the temperature values in real-time of different portions of the epitaxial growth chamber 100. In accordance with an embodiment, each temperature sensor may be a pyrometer. In some, embodiments, each pyrometer may be able to monitor temperatures in a range within which InGaAs or GaAs can be epitaxially grown. In some embodiments, each pyrometer may be able to detect wavelengths in a range from about 0.9 um to about 1.6 um. As shown in FIG. 1A, four backside pyrometers 6 may be placed below a level of the susceptor 106. A first backside pyrometer 6a is oriented such that it detects the thermal radiation from a center of a backside surface of the wafer 110 in the heating zone 1. A second backside pyrometer 6b is oriented such that it detects the thermal radiation from a point on the backside surface of the wafer 110 in between the heating zone 1 and the heating zone 2. A third backside pyrometer 6c is oriented such that it detects the thermal radiation from a point on the backside surface of the wafer 110 in between the heating zone 2 and the heating zone 3. A fourth backside pyrometer 6d is oriented such that it detects the thermal radiation from a point on the backside surface of the wafer 110 in between the heating zone 3 and the heating zone 4. The first backside pyrometer 6a, the second backside pyrometer 6b, the third backside pyrometer 6c, and the fourth backside pyrometer 6d may detect the thermal radiation from the respective points on the backside surface of the wafer 110 through openings in the susceptor 106. In some embodiments, the backside pyrometers 6 may detect the thermal radiation from the respective points on the backside surface of the wafer 110 through one or more quartz windows in the susceptor 106. In some embodiments, the backside pyrometers 6 can be used to detect the thermal radiation from points on the backside surface of the wafer 110 that are between adjacent heating zones (e.g., heating zone 1, heating zone 2, heating zone 3, or heating zone 4) or from points on the backside surface of the wafer 110 that are at the center of respective heating zones (e.g., heating zone 1, heating zone 2, heating zone 3, or heating zone 4).

An algorithm program uses the thermal radiation detected by the first backside pyrometer 6a, the second backside pyrometer 6b, the third backside pyrometer 6c, and the fourth pyrometer 6d to estimate the in-situ, real-time temperatures of each measured point on the backside surface of the wafer 110. In addition, a first frontside pyrometer 8a is oriented such that it detects the thermal radiation of the film 124 on the frontside of the wafer 110 in the heating zone 1 from a point that is aligned to be vertically above the point at which the first backside pyrometer 6a detected the thermal radiation from the backside surface of the wafer 110. A second frontside pyrometer 8b is oriented such that it detects the thermal radiation of the film 124 on the frontside of the wafer 110 from a point that is aligned to be vertically above the point at which the second backside pyrometer 6b detected the thermal radiation from the backside surface of the wafer 110. A third frontside pyrometer 8c is oriented such that it detects the thermal radiation of the film 124 on the frontside of the wafer 110 from a point that is aligned to be vertically above the point at which the third backside pyrometer 6c detected the thermal radiation from the backside surface of the wafer 110. A fourth frontside pyrometer 8d is oriented such that it detects the thermal radiation of the film 124 on the frontside of the wafer 110 from a point that is aligned to be vertically above the point at which the fourth backside pyrometer 6d detected the thermal radiation from the backside surface of the wafer 110. In this way each of the first, second, third, and fourth backside pyrometers 6 is paired with a corresponding first, second, third, or fourth frontside pyrometer 8 to measure thermal radiation emitted from the film 124 on a frontside of the wafer 110 and the thermal radiation emitted from a backside surface of the wafer 110 within a heating zone or between adjacent heating zones (e.g., heating zone 1, heating zone 2, heating zone 3, and heating zone 4). By combining the measured thermal radiation values of each of the first frontside pyrometer 8a, second frontside pyrometer 8b third frontside pyrometer 8c, and fourth frontside pyrometer 8d with its corresponding first backside pyrometer 6a, second backside pyrometer 6b, third backside pyrometer 6c, or fourth backside pyrometer 6d, a central processing unit (CPU) 516 is able to use the combined measured values and runs an algorithm program (described subsequently in FIG. 2) that can estimate the in-situ, real-time thickness of the film 124 being grown at the point on the frontside of the wafer 110 that is being measured. FIG. 1A illustrates each front side pyrometer 8 and a corresponding backside pyrometer 6 functioning as a pair (e.g., frontside pyrometer 8a and backside pyrometer 6a) of pyrometers. Although four frontside pyrometers 8 and four backside pyrometers 6 are illustrated to form three pairs of pyrometers in FIG. 1A, other embodiments may comprise two or more pairs of pyrometers.

Figure 1C:
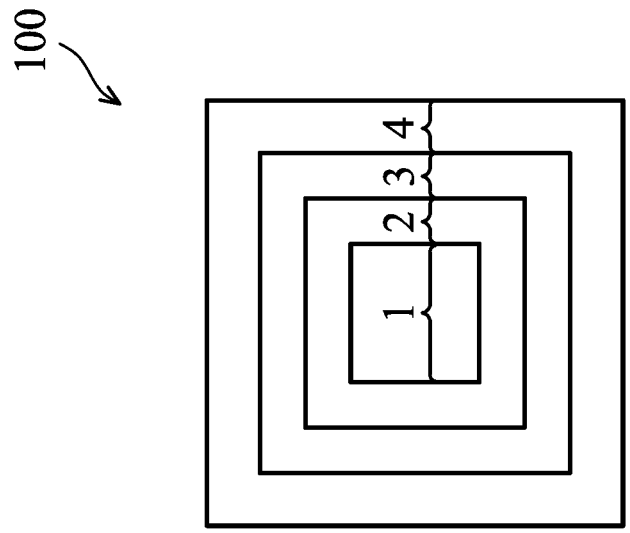
FIG. 1B through 1C illustrate plan views of an inner chamber of an epitaxial growth chamber, in accordance with embodiments.
Figure 1B:
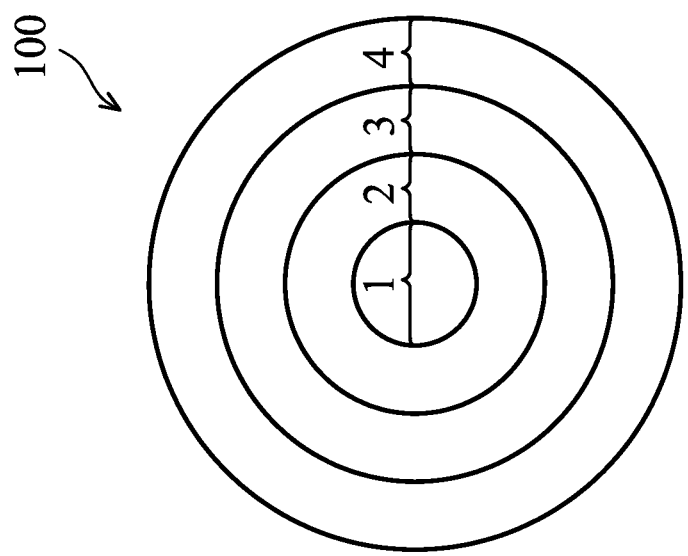

FIG. 1B through 1C illustrate plan views of the inner chamber 105 of the epitaxial growth chamber 100, in accordance with embodiments. In FIG. 1B, the heating zone 1, heating zone 2, heating zone 3, and heating zone 4 of the epitaxial growth chamber 100 are shown as concentric rings within the inner chamber 105. In FIG. 1C, the heating zone 1, heating zone 2, heating zone 3, and heating zone 4 of the epitaxial growth chamber 100 are shown as concentric rectangles within the inner chamber 105. The heating zone 1, heating zone 2, heating zone 3, and heating zone 4 of the epitaxial growth chamber 100 may also comprise concentric squares in accordance with other embodiments.

Figure 2:
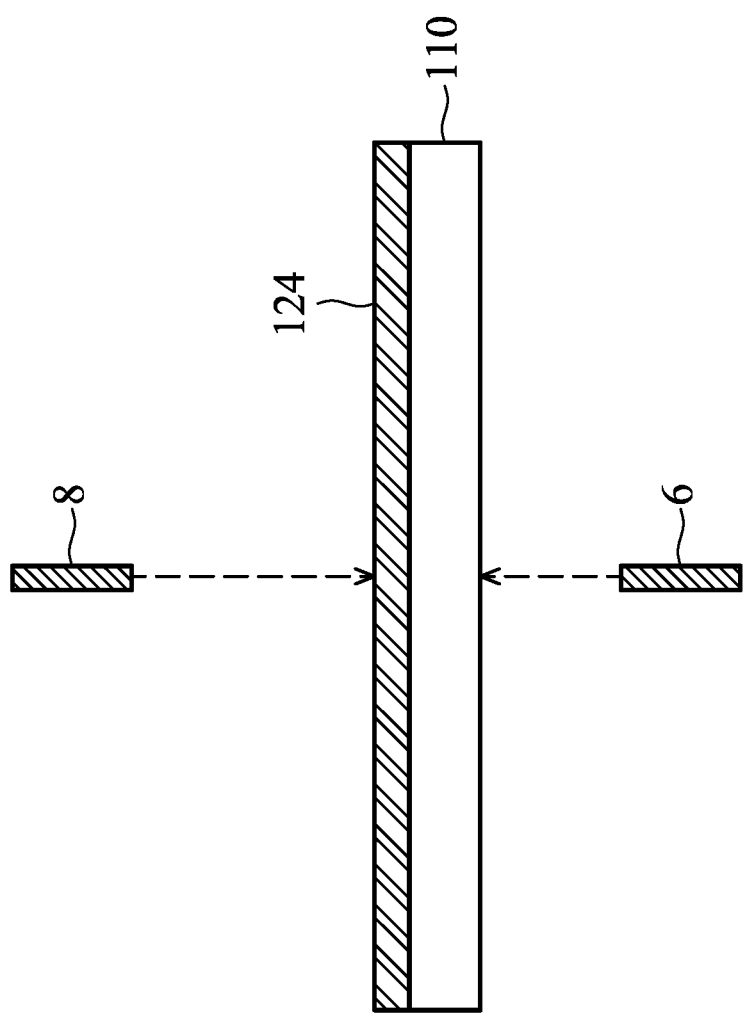
FIG. 2 illustrates a cross-sectional view of a portion of a wafer during an epitaxial film growth process.

FIG. 2 illustrates a cross-sectional view of a portion of the wafer 110 as the epitaxial film 124 is being grown on the wafer 110 in the epitaxial growth chamber 100 (previously described in FIG. 1A). The portion of the wafer 110 may be within a heating zone or between heating zones (e.g., heating zone 1, heating zone 2, heating zone 3, and heating zone 4). FIG. 2 also illustrates a frontside pyrometer 8 and a corresponding backside pyrometer 6 that form a pair of pyrometers (similar to that described previously in FIG. 1A) to detect thermal radiation emitted from the film 124 on a frontside of the wafer 110 and the thermal radiation emitted from a backside surface of the wafer 110 within a heating zone or between adjacent heating zones (e.g., heating zone 1, heating zone 2, heating zone 3, and heating zone 4). The frontside pyrometer 8 is oriented such that it detects the thermal radiation of the film 124 on the frontside of the wafer 110 from a point that is aligned to be vertically above a point at which the backside pyrometer 6 detected the thermal radiation from the backside surface of the wafer 110.

The emissivity value ε of the wafer 110 (e.g., silicon) from the backside surface of the wafer 110 can be measured, or is already known and assumed to be constant during the epitaxial growth process because there is no epitaxial film 124 being grown on the backside surface of the wafer 110 that can interfere with the thermal radiation measurement from the point on the backside surface of the wafer 110 using the backside pyrometer 6. The measured thermal radiation is sent to the temperature measurement unit 416 (shown in FIG. 1A) where the temperature at the point on the backside surface of the wafer 110 is calculated by an algorithm program according to the mathematical formula.

$$T(K) = \left( \frac{\frac{-c_2}{\lambda_{m,n}}}{\ln\left(\frac{\lambda_{m,n}^5 W_{m,n}}{c_1 \varepsilon}\right)} \right) = \left( \frac{\frac{-c_2}{\lambda_{m,n}}}{\ln\left(\frac{\lambda_{m,n}^5 I_{m,n}}{c_1 \varepsilon * SF}\right)} \right)$$

where T(K) is the absolute temperature of the point on the backside surface of the wafer 110 measured by the backside pyrometer $\lambda_{m,n}$ is the wavelength, $W_{m,n}$ is the actual radiant power intensity from the measured point on the backside surface of the wafer 110, SF is the sensor factor of the backside pyrometer 6, the sensor factor being a calibration value that is used to convert the detected thermal radiation values by the backside pyrometer 6 to actual radiation power values, $I_{m,n}$ is the signal intensity of the thermal radiation received by the backside pyrometer 6, $c_1$ is the first radiation constant, and $c_2$ is the second radiation constant. A plurality of backside pyrometers 6 (described previously in FIG. 1A) may be employed in a similar fashion to in-situ monitor, the temperature distribution of the backside surface of the wafer 110 in different heating zones (e.g., heating zone 1, heating zone 2, heating zone 3, and heating zone 4) from a center of the wafer 110 to an edge of the wafer 110.

Still referring to FIG. 2, the frontside pyrometer 8 is oriented such that it detects the thermal radiation of the film 124 on the frontside of the wafer 110 from a point that is aligned to be vertically above a point at which the backside pyrometer 6 detected the thermal radiation from the backside surface of the wafer 110. However, the detected thermal radiation from the point on the film 124 on the frontside of the wafer 110 may be influenced by the thickness and the composition of the epitaxial film 124 being grown on the wafer 110, as well as the wafer 110 below the epitaxial film 124, leading to changes in values of emissivity that make it difficult to accurately determine the temperature of the film 124 in the same manner as for the backside surface of the wafer 110. The emissivity value obtained from the point on the film 124 on the frontside of the wafer 110 measured by the frontside pyrometer 8 therefore contains information about the temperature of the film 124 and thickness of the film 124, at the point being measured. The detected thermal radiation values from the point on the film 124 on the frontside of the wafer 110 are sent to the thickness analysis unit 316 (shown in FIG. 1A). The previously calculated temperature value at the point on the backside surface of the wafer 110 that was measured by the backside pyrometer 6 is also sent to the thickness analysis unit 316 and by assuming that the frontside of the wafer 110 and the backside of the wafer 110 are thermally equivalent (i.e., have the same temperature), an in-situ, real-time value of thickness of the film 124 at the point that is being measured by the frontside pyrometer 8 can be extracted by the algorithm program. To calculate the in-situ, real-time emissivity of the point on the film 124, the algorithm program directs the thickness analysis unit 316 to use the detected thermal radiation values from the point on the film 124 on the frontside of the wafer 110 measured by the frontside pyrometer 8 in combination with the previously determined temperature value from the point measured on the backside surface of the wafer 110 that was measured by the backside pyrometer 6.

Using the calculated values of the in-situ, real-time emissivity ε of the point on the film 124 determined by the thickness analysis unit 316, the detected thermal radiation values from the point on the film 124 on the frontside of the wafer 110 measured by the frontside pyrometer 8, and the previously calculated temperature value at the point on the backside surface of the wafer 110 that was measured by the backside pyrometer 6, the algorithm program then directs the thickness analysis unit 316 to extract the in-situ, real-time thickness value of the film 124 at the point on the frontside of the wafer 110 being measured by the frontside pyrometer 8. A plurality of backside pyrometers 6 and frontside pyrometers 8 (described previously in FIG. 1A) may be employed in a similar fashion to in-situ monitor the thickness distribution across a film 124 that is being grown on the wafer 110 in different heating zones (e.g., heating zone 1, heating zone 2, heating zone 3, and heating zone 4) from a center of the wafer 110 to an edge of the wafer 110.

In accordance with an embodiment, the combination of the frontside pyrometers 8 and the backside pyrometers 6 (e.g., described in FIG. 1A) can provide adequate information for an algorithm program to direct the thickness analysis unit 316 to determine the in-situ, real-time thickness distribution across the film 124 that is being grown on the wafer 110. The algorithm program is run and controlled by the CPU 516 (shown in FIG. 1A). The CPU 516 also instructs the lamp power control unit 216 (shown in FIG. 1A) to use the calculated in-situ, real-time temperature values of the backside surface of the wafer 110 measured by the backside pyrometers 6 in each of the heating zones or in between adjacent heating zones (e.g., heating zone 1, heating zone 2, heating zone 3, and heating zone 4) and to adjust the temperature distribution of the wafer 110 in these heating zones accordingly, by changing a power output of the heating sources 112 in each of these heating zones as well as the power output ratio between different heating sources 112 in these different heating zones (e.g., heating zone 1, heating zone 2, heating zone 3, and heating zone 4).

The lamp power control unit 216 may generate four or more output control signals (one for each heating zone of the epitaxial growth chamber 100), which are sent to the lamp power spreader 22 (shown in FIG. 1A). The lamp power spreader 22 then distributes power to the heating sources 112 in each heating zone (e.g., heating zone 1, heating zone 2 . . . ) of the epitaxial growth chamber 100 as per the output control signals from the lamp power control unit 216. The lamp power control unit 216 may employ a feedback network in each heating zone (e.g., heating zone 1, heating zone 2 . . . ) upon which the heating sources 112 (shown in in FIG. 1A) in each of the heating zone 1, the heating zone 2, the heating zone 3, and the heating zone 4 may provide more power as well as radiation energy when the detected in-situ, real-time temperature value of the backside surface of the wafer 110 in that heating zone or in between that heating zone and an adjacent heating zone shows a temperature that is less than a predetermined set point. In contrast, when the detected in-situ, real-time temperature value of the backside surface of the wafer 110 in that heating zone or in between that heating zone and an adjacent heating zone shows a temperature that is more than the predetermined set point, the lamp power control unit 216 may cut a power output to the heating sources 112 in that heating zone accordingly. Using a feedback network to automatically adjust a heating source 112 power output in a particular heating zone so as to compensate the error between the actual temperature and the predetermined set point is within the ability of a person having ordinary skill in the art, and hence is not discussed in further detail.

The plurality of backside pyrometers 6 (e.g., described in FIG. 1A) can provide adequate information for a CPU 516 to run an algorithm program that directs the temperature measurement unit 416 to determine the in-situ, real-time temperature distribution across a backside surface of the wafer 110 across the heating zone 1, the heating zone 2, the heating zone 3, and the heating zone 4 of the epitaxial growth chamber 100. In addition, the combination of the frontside pyrometers 8 and the backside pyrometers 6 (e.g., described in FIG. 1A) can provide adequate information for a CPU 516 to run an algorithm program that directs the thickness analysis unit 316 to determine the in-situ, real-time thickness distribution across the film 124 that is being grown on the wafer 110 across the heating zone 1, the heating zone 2, the heating zone 3, and the heating zone 4 of the epitaxial growth chamber 100. The CPU 516 also directs the gas flow control unit 116 (shown in FIG. 1A) to use the calculated in-situ, real-time temperature values of the backside surface of the wafer 110 and thickness values of the film 124 that is being grown on the wafer 110 in each of the heating zones or in between adjacent heating zones (e.g., heating zone 1, heating zone 2, heating zone 3, and heating zone 4) and adjust the flow of gases or precursors supplied by the gas supply source 118 (shown in FIG. 1A) into the epitaxial growth chamber 100 accordingly.

The gas supply source 118 (shown in FIG. 1A) may be controlled by the gas flow control unit 116. The gas supply source 118 may include two or more flow ratio controllers 180 that are used to control the flow rate and the composition of gases or precursors flowing into the epitaxial growth chamber 100. In an embodiment, the gas flow control unit 116 can be used to control an average thickness of the film 124 that is being grown across the wafer 110 by adjusting the flow rate and the composition of gases or precursors flowing into the epitaxial growth chamber 100.

The gas flow control unit 116 may employ a feedback network in each heating zone (e.g., heating zone 1, heating zone 2 . . . ) upon which the gas flow control unit 116 (shown in in FIG. 1A) may adjust flow rates of gases or precursors using the flow ratio controllers 180 to increase or decrease flow rates of gases or precursors flowing into the epitaxial growth chamber 100 and therefore control an average thickness of the film 124 that is being grown across the wafer 110.

It has been observed that an embodiment that includes an epitaxial growth chamber 100 that comprises a series of frontside pyrometers 8 located at different points in the different heating zones or between different heating zones (e.g., heating zone 1, heating zone 2, heating zone 3, and heating zone 4) of the epitaxial growth chamber 100 to measure the thermal radiation emitted from a film 124 being grown on a frontside of a wafer 110, and a series of backside pyrometers 6 located at different points in the different heating zones or between different heating zones (e.g., heating zone 1, heating zone 2, heating zone 3, and heating zone 4) of the epitaxial growth chamber 100 to measure the thermal radiation emitted from a backside surface of the wafer 110 has advantages. For example, providing only a single frontside pyrometer 8 and a single backside pyrometer 6 may lead to an insufficient number of measurement points to monitor the real-time temperature distribution of the backside surface of the wafer from a center of the wafer to an edge of the wafer. In addition, providing only a single frontside pyrometer 8 and a single backside pyrometer 6 may lead to an insufficient number of measurement points to monitor the in-situ, real-time thickness of the epitaxial film 124 being grown on a frontside of the wafer 110, across the whole film 124 from a center of the wafer 110 to an edge of the wafer 110. Further, providing only a single frontside pyrometer 8 and a single backside pyrometer 6 may lead to an insufficient number of measurement points to allow for an ability to use a feedback control system (described subsequently in FIG. 3) utilizing in-situ measurements of the thickness of the epitaxial film 124 being grown on a frontside of a wafer 110 and in-situ measurements of temperature of a backside surface of the wafer 110 in each heating zone or between adjacent heating zones (e.g., heating zone 1, heating zone 2, heating zone 3, and heating zone 4) to modulate the power of the heating sources in the heating zone and the amount of the various process gases flowing into the growth chamber. This may lead to a reduced temperature uniformity of the backside surface of the wafer 110 and a reduced thickness uniformity of the epitaxial film 124 that is being grown on the wafer 110. Accordingly, manufacturing defects may result.

Figure 3:
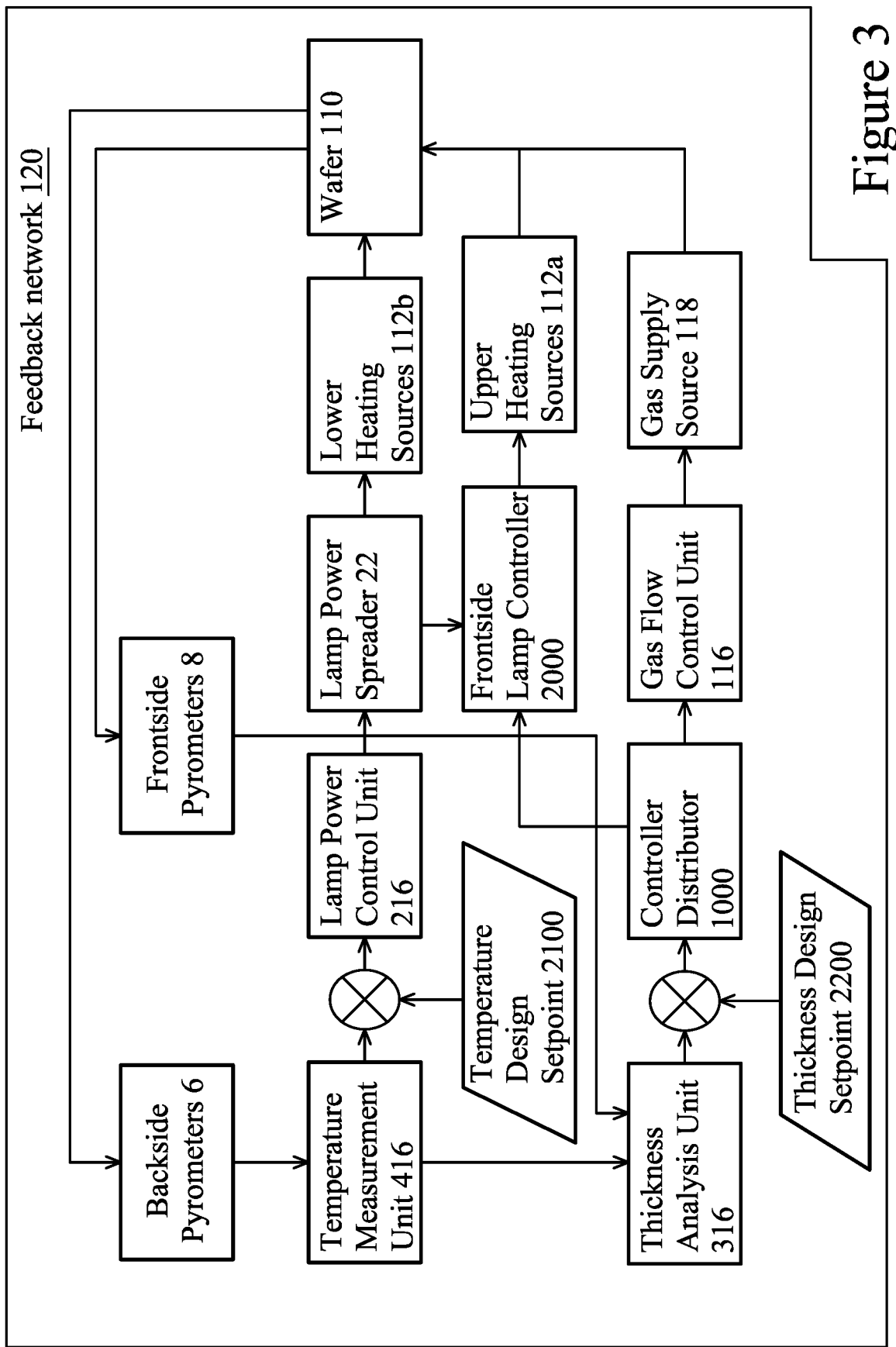
FIG. 3 is a schematic view of a feedback network in accordance with some embodiments.

Referring now primarily to FIG. 3, but with continued reference to FIGS. 1A through 2, a feedback control system is shown in which the lamp power control unit 216 may in real time dynamically adjust a temperature distribution of the wafer 110, and thus cause the thickness of the film 124 at specific locations on the film 124 to be adjusted to create a uniform thickness throughout the film 124. The lamp power control unit 216 may do this based on the detected thermal radiation using the backside pyrometers 6, which is then sent to a temperature measurement unit 416 that calculates the in-situ, real-time temperature values of a backside surface of the wafer 110 in each of the heating zones or in between adjacent heating zones (e.g., heating zone 1, heating zone 2, heating zone 3, and heating zone 4) of the epitaxial growth chamber 100. The lamp power control unit 216 uses the calculated in-situ, real-time temperature values of the backside surface of the wafer 110 in each of the heating zones or in between adjacent heating zones (e.g., heating zone 1, heating zone 2, heating zone 3, and heating zone 4) and adjusts the temperature distribution of the wafer 110 accordingly, by changing a power output of the heating sources 112 in each heating zone as well as the power output ratio between different heating sources 112 in different heating zones (e.g., heating zone 1, heating zone 2, heating zone 3, and heating zone 4).

The lamp power control unit 216 may generate four or more output control signals (one for each heating zone of the epitaxial growth chamber 100), which are sent to the lamp power spreader 22. The lamp power spreader 22 then distributes power to the lower heating sources 112*b* in each heating zone (e.g., heating zone 1, heating zone 2 . . . ) of the epitaxial growth chamber 100 as per the output control signals from the lamp power control unit 216. In addition, the lamp power spreader 22, through the frontside lamp controller 2000, distributes power to the upper heating sources 112*a* in each heating zone (e.g., heating zone 1, heating zone 2 . . . ) of the epitaxial growth chamber 100 as per the output control signals from the lamp power control unit 216. The lamp power control unit 216 may employ the feedback network 120 upon which the heating sources 112 (shown in in FIG. 1A) in each of the heating zone 1, the heating zone 2, the heating zone 3, and the heating zone 4 may provide more power as well as radiation energy when the detected in-situ, real-time temperature value of the backside surface of the wafer 110 in that heating zone or between that heating zone and an adjacent heating zone shows a temperature that is less than a predetermined temperature design set point 2100. In contrast, when the detected in-situ, real-time temperature value of the backside surface of the wafer 110 in a heating zone or between a heating zone and an adjacent heating zone shows a temperature that is more than the predetermined temperature design set point 2100, the lamp power control unit 216 may cut a power output to the heating sources 112 in that heating zone accordingly.

In FIG. 3, the feedback control system also includes the gas flow control unit 116 that may in real time dynamically adjust the flow of gases or precursors supplied into the epitaxial growth chamber 100 and control an average thickness of the film 124 that is being grown across the wafer 110. The gas flow control unit 116 may do this based on the previously calculated in-situ, real-time temperature values of the backside surface of the wafer 110 in each of the heating zones or in between adjacent heating zones (e.g., heating zone 1, heating zone 2, heating zone 3, and heating zone 4) and the thermal radiation detected using the frontside pyrometers 8, which are sent to the thickness analysis unit 316 that calculates the in-situ, real-time thickness values of the film 124 that is being grown on the wafer 110 in each of the heating zones or in between adjacent heating zones (e.g., heating zone 1, heating zone 2, heating zone 3, and heating zone 4).

The gas flow control unit 116 may employ the feedback network 120 in the heating zone 1, the heating zone 2, the heating zone 3, and the heating zone 4 upon which the gas flow control unit 116 may adjust flow rates of gases or precursors using the flow ratio controllers 180 in the gas supply source 118 to increase or decrease flow rates of gases or precursors flowing into the epitaxial growth chamber 100 and therefore control the average thickness of the film 124 that is being grown across the wafer 110 when the average thickness value calculated from the detected in-situ, real-time thickness values of the film 124 on the frontside of the wafer 110 in one or more heating zones or between heating zones shows that the average thickness value is less than or greater than a predetermined average thickness design setpoint 2200, indicating that a growth rate of the film 124 is less than or greater than a predetermined set point growth rate. In addition, when the detected in-situ, real-time thickness values of the film 124 on the frontside of the wafer 110 in one or more heating zones or between heating zones shows an average thickness value that is less than or greater than a predetermined average thickness design setpoint 2200, a controller distributor 1000 may employ the feedback network 120 to direct the frontside lamp controller 2000 to adjust the power as well as radiation energy provided by the upper heating sources 112*a* (shown in in FIG. 1A) in one or more of the heating zones (e.g., heating zone 1, heating zone 2 . . . ) accordingly.

The embodiments of the present disclosure have some advantageous features. The use of disclosed methods may result in the ability to monitor the real-time temperature distribution of a backside surface of a wafer 110 from a center of the wafer 110 to an edge of the wafer 110 by combining the measured thermal radiation values of a plurality of backside pyrometers 6. In addition, by combining the measured thermal radiation values of a frontside pyrometer 8 and its corresponding backside pyrometer 6, an algorithm program can estimate the in-situ, real-time thickness of the film 124 being grown at the point on the frontside of the wafer 110 that is being measured. The embodiments of the present disclosure describe a configuration that allows for in-situ, real-time monitoring of the thickness of an epitaxial film 124 being grown on a frontside of a wafer 110, across the whole film 124 from a center of the wafer 110 to an edge of the wafer 110. The embodiments of the present disclosure also describe a configuration that allows for in-situ, real-time monitoring of the temperature distribution of a backside surface of the wafer 110, from the center of the wafer 110 to the edge of the wafer 110. In addition, the embodiments of this disclosure allow for an improved temperature uniformity and thickness uniformity across the grown film 124. Further, the embodiments of this disclosure allow for an ability to use a feedback control system utilizing in-situ measurements of the thickness of the epitaxial film 124 being grown on a frontside of a wafer 110 and in-situ measurements of temperature of a backside surface of the wafer 110 in each zone to modulate the power of the heating sources in the zone and the amount of the various process gases flowing into the epitaxial growth chamber 100.

In accordance with an embodiment, an apparatus includes a susceptor in an epitaxial growth chamber; a first pyrometer configured to monitor thermal radiation from a first point on a backside of a wafer on the susceptor; a second pyrometer configured to monitor thermal radiation from a second point on the backside of the wafer on the susceptor; a first heating source in a first region of the epitaxial growth chamber and a second heating source in a second region of the epitaxial growth chamber, where a first controller is configured to adjust an output of the first heating source based upon the monitored thermal radiation from the first point, and an output of the second heating source based upon the monitored thermal radiation from the second point; a third pyrometer configured to monitor thermal radiation from a third point on a frontside of the wafer; and a fourth pyrometer configured to monitor thermal radiation from a fourth point on the frontside of the wafer, where a second controller is configured to adjust a flow rate of one or more precursors injected into the epitaxial growth chamber based upon the monitored thermal radiation from the first, second, third, and fourth points. In an embodiment, the first pyrometer and the second pyrometer monitor thermal radiation from the first point and the second point on the backside of the wafer through one or more quartz windows in the susceptor. In an embodiment, the first heating source is positioned above or below the susceptor and the second heating source is positioned above or below the susceptor. In an embodiment, the first heating source and the second heating source include resistance heaters, radio frequency inductive heaters, lamps, or lamp banks. In an embodiment, the first heating source and the second heating source include tungsten lamps, tungsten lamp banks, or arc lamps. In an embodiment, the third point is aligned to be vertically above the first point and the fourth point is aligned to be vertically above the second point. In an embodiment, the first, second, third, and fourth pyrometers are able to detect wavelengths in a range from 0.9 um to 1.6 um. In an embodiment, further including a third heating source in the first region of the epitaxial growth chamber positioned on an opposite side of the susceptor as the first heating source; and a fourth heating source in the second region of the epitaxial growth chamber positioned on an opposite side of the susceptor as the second heating source. In an embodiment, further including a fifth pyrometer configured to monitor thermal radiation from a fifth point on the backside of the wafer; and a sixth pyrometer configured to monitor thermal radiation from a sixth point on the frontside of the wafer, where the sixth point is aligned to be vertically above the fifth point. In an embodiment, further including a fifth heating source in a third region of the epitaxial growth chamber; and a sixth heating source in a fourth region of the epitaxial growth chamber, where the first controller is configured to adjust an output of the fifth heating source based upon the monitored thermal radiation from the fifth point, and an output of the sixth heating source based upon monitored thermal radiation by a seventh pyrometer from a seventh point within the epitaxial growth chamber.

In accordance with an embodiment, a system includes a chamber comprising a susceptor; a first pyrometer configured to monitor thermal radiation from a first point on a backside of a wafer on the susceptor; and a second pyrometer configured to monitor thermal radiation from a second point on a frontside of the wafer on the susceptor; a first controller to receive thermal feedback from the first pyrometer, where the first controller is configured to adjust a heat output of first heating sources in a first region of the chamber based upon the thermal feedback from the first pyrometer; and a second controller to receive thermal feedback from the second pyrometer, where the second controller is configured to adjust a flow rate of one or more precursors injected into the chamber based upon the thermal feedback from the first pyrometer and the second pyrometer. In an embodiment, the first heating sources in the first region of the chamber includes at least one heating source above the susceptor and at least one heating source below the susceptor. In an embodiment, further including a third pyrometer configured to monitor thermal radiation from a third point on the backside of the wafer on the susceptor; and a fourth pyrometer configured to monitor thermal radiation from a fourth point on the frontside of the wafer on the susceptor. In an embodiment, the first controller receives thermal feedback from the third pyrometer, where the first controller is configured to adjust a heat output of second heating sources in a second region of the chamber based upon the thermal feedback from the third pyrometer.

In accordance with an embodiment, a method includes adjusting a thickness of an epitaxial film growth in an epitaxial film growth chamber, where adjusting the thickness includes measuring thermal radiation from a backside of a wafer at a first plurality of locations to determine temperatures of the wafer at each of the first plurality of locations, where the epitaxial film growth is formed on the wafer; measuring thermal radiation from a frontside of the wafer at a second plurality of locations; adjusting an output of heating sources in different regions of the epitaxial film growth chamber based on the temperatures of the wafer at each of the first plurality of locations, where heating sources in each region of the epitaxial film growth chamber have their output adjusted based on a temperature of the wafer at a corresponding one of the first plurality of locations; determining thickness variations in the epitaxial film growth based on the temperatures of the wafer at the first plurality of locations and the measured thermal radiation at the second plurality of locations; and adjusting a flow rate of one or more precursors injected into the epitaxial film growth chamber based on the determined thickness variations. In an embodiment, the adjusting the flow rate includes using two or more flow ratio controllers to control the flow rate and composition of gases or precursors flowing into the epitaxial film growth chamber. In an embodiment, each of the second plurality of locations is vertically aligned to be above a corresponding one of the first plurality of locations. In an embodiment, the heating sources in each region include at least one heating source above the wafer and at least one heating source below the wafer. In an embodiment, measuring the thermal radiation from the first plurality of locations includes using two or more pyrometers located below the wafer and measuring the thermal radiation from the second plurality of locations includes using two or more pyrometers located above the wafer. In an embodiment, measuring the thermal radiation from the first plurality of locations and the second plurality of locations includes using a respective pyrometer to detect wavelengths in a range from 0.9 um to 1.6 um at each corresponding location of the first plurality of locations and the second plurality of locations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An apparatus comprising:
 a susceptor in an epitaxial growth chamber, the susceptor configured to be able to rotate, the susceptor comprising a non-transparent material;
 a plurality of lower pyrometers configured to monitor thermal radiation from corresponding ones of a first plurality of points on a backside of a wafer on the rotating susceptor, wherein the number of lower pyrometers of the plurality of lower pyrometers is equal to the number of points of the first plurality of points, wherein a width of a gap that is disposed between the backside of the wafer and a top surface of the rotating susceptor decreases continuously in a direction from a center of the wafer to an edge of the wafer, wherein a thickness of the susceptor decreases continuously in a direction from a center of the susceptor to an edge of the susceptor, wherein a center portion of the susceptor has a thickness that is greater than thicknesses of other portions of the susceptor, wherein the plurality of lower pyrometers comprise:
  a first pyrometer configured to monitor thermal radiation from a first point of the first plurality of points on the backside of the wafer on the rotating susceptor, the first pyrometer also being configured to monitor the thermal radiation from the first point while being disposed under and being overlapped by the susceptor and the wafer; and
  a second pyrometer configured to monitor thermal radiation from a second point of the first plurality of points on the backside of the wafer on the rotating susceptor, the second pyrometer also being configured to monitor the thermal radiation from the second point while being disposed under and being overlapped by the susceptor and the wafer;
a first heating source in a first region of the epitaxial growth chamber and a second heating source in a second region of the epitaxial growth chamber, wherein a first controller is configured to adjust an output of the first heating source based upon the monitored thermal radiation from the first point, and an output of the second heating source based upon the monitored thermal radiation from the second point, wherein a center portion of the first heating source is disposed at a level that is between a topmost surface of the first pyrometer and a bottommost surface of the first pyrometer, and between a topmost surface of the second pyrometer and a bottommost surface of the second pyrometer, and wherein the first heating source extends laterally between a first sidewall of the first pyrometer and a second sidewall of the second pyrometer;
a third pyrometer configured to monitor thermal radiation from a third point on a frontside of the wafer;
a fourth pyrometer configured to monitor thermal radiation from a fourth point on the frontside of the wafer, wherein a second controller is configured to adjust a flow rate of one or more precursors injected into the epitaxial growth chamber based upon the monitored thermal radiation from the first, second, third, and fourth points; and
a processing unit configured to assume that a first temperature of the first point and a second temperature of the third point are the same and estimate a first real-time thickness of an epitaxial film growing at the third point on the frontside of the wafer, and wherein the processing unit is also configured to combine values of the monitored thermal radiation from the second point and values of the monitored thermal radiation from the fourth point and estimate a second real-time thickness of the epitaxial film growing at the fourth point on the frontside of the wafer.

2. The apparatus of claim 1, wherein the first pyrometer and the second pyrometer monitor thermal radiation from the first point and the second point on the backside of the wafer through one or more quartz windows in the susceptor.

3. The apparatus of claim 1, wherein the first heating source is positioned below the susceptor and the second heating source is positioned below the susceptor.

4. The apparatus of claim 1, wherein the first heating source and the second heating source comprise resistance heaters, radio frequency inductive heaters, lamps, or lamp banks.

5. The apparatus of claim 4, wherein the first heating source and the second heating source comprise tungsten lamps, tungsten lamp banks, or arc lamps.

6. The apparatus of claim 1, wherein the third point is aligned to be vertically above the first point and the fourth point is aligned to be vertically above the second point.

7. The apparatus of claim 1, wherein the first, second, third, and fourth pyrometers are able to detect wavelengths in a range from 0.9 um to 1.6 um.

8. The apparatus of claim 1, further comprising:
  a third heating source in the first region of the epitaxial growth chamber positioned on an opposite side of the susceptor as the first heating source; and
  a fourth heating source in the second region of the epitaxial growth chamber positioned on an opposite side of the susceptor as the second heating source.

9. The apparatus of claim 1, wherein the plurality of lower pyrometers further comprises:
  a fifth pyrometer configured to monitor thermal radiation from a fifth point on the backside of the wafer.

10. The apparatus of claim 9 further comprising:
  a sixth pyrometer configured to monitor thermal radiation from a sixth point on the frontside of the wafer, wherein the sixth point is aligned to be vertically above the fifth point;
  a fifth heating source in a third region of the epitaxial growth chamber; and
  a sixth heating source in a fourth region of the epitaxial growth chamber, wherein the first controller is configured to adjust an output of the fifth heating source based upon the monitored thermal radiation from the fifth point.

11. A system comprising:
a chamber comprising:
  a susceptor configured to be able to rotate;
  a plurality of lower pyrometers configured to monitor thermal radiation from corresponding ones of a first plurality of points on a backside of a wafer on the rotating susceptor, wherein the number of lower pyrometers of the plurality of lower pyrometers is equal to the number of points of the first plurality of points, wherein the plurality of lower pyrometers comprises:
    a first pyrometer configured to monitor thermal radiation from a first point of the first plurality of points at a center of the backside of the wafer on the rotating susceptor, wherein a width of a gap that is disposed between the backside of the wafer and a top surface of the rotating susceptor decreases continuously in a direction from the center of the wafer to an edge of the wafer, wherein the wafer is in physical contact with the susceptor, wherein a thickness of the susceptor decreases continuously in a direction from a center of the susceptor to an edge of the susceptor, wherein a center portion of the susceptor has a thickness that is greater than thicknesses of other portions of the susceptor; and
    a second pyrometer configured to monitor thermal radiation from a second point of the first plurality of points on the backside of the wafer on the rotating susceptor;
  a third pyrometer configured to monitor thermal radiation from a third point at a center of a frontside of the wafer on the rotating susceptor;
a first controller to receive thermal feedback from the first pyrometer, wherein the first controller is configured to adjust a heat output of first heating sources in a first region of the chamber based upon the thermal feedback from the first pyrometer; and a second controller to receive thermal feedback from the third pyrometer, wherein the second controller is configured to adjust a flow rate of one or more precursors injected into the chamber based upon the thermal feedback from the first pyrometer and the third pyrometer.

12. The system of claim 11, wherein the first heating sources in the first region of the chamber comprise at least one heating source above the susceptor and at least one heating source below the susceptor.

13. The system of claim 11 further comprising:
a fourth pyrometer configured to monitor thermal radiation from a fourth point on the frontside of the wafer on the rotating susceptor.

14. The system of claim 13, wherein the first controller receives thermal feedback from the second pyrometer, wherein the first controller is configured to adjust a heat output of second heating sources in a second region of the chamber based upon the thermal feedback from the second pyrometer.

15. An apparatus comprising:
a growth chamber;
a susceptor within the growth chamber, the susceptor configured to support a wafer, wherein the susceptor comprises a non-transparent material, wherein a thickness of the susceptor decreases continuously in a direction from a center of the susceptor to an edge of the susceptor, wherein a center portion of the susceptor has a thickness that is greater than thicknesses of other portions of the susceptor;
a first heating source, a second heating source, a third heating source, and a fourth heating source within the growth chamber, the first heating source and the third heating source being disposed above the susceptor, and the second heating source and the fourth heating source being disposed below the susceptor, wherein the susceptor is configured to transfer heat to a backside of the wafer using conduction thermal transfer from the susceptor to the backside of the wafer;
a plurality of lower thermal radiation sensing devices oriented to measure thermal radiation from corresponding ones of a first plurality of points on the backside of the wafer on the susceptor, wherein the number of thermal radiation sensing devices of the plurality of lower thermal radiation sensing devices is equal to the number of points of the first plurality of points, wherein the plurality of lower thermal radiation sensing devices comprises:
a first thermal radiation sensing device disposed between the second heating source and the fourth heating source, the first thermal radiation sensing device being oriented to measure thermal radiation from a first point of the first plurality of points on the backside of the wafer on the susceptor; and
a second thermal radiation sensing device oriented to measure thermal radiation from a second point of the first plurality of points on the backside of the wafer on the susceptor, wherein a center portion of the second heating source is disposed at a level that is between a topmost surface of the first thermal radiation sensing device and a bottommost surface of the first thermal radiation sensing device, and between a topmost surface of the second thermal radiation sensing device and a bottommost surface of the second thermal radiation sensing device, and wherein the fourth heating source extends laterally between a first sidewall of the first thermal radiation sensing device and a second sidewall of the second thermal radiation sensing device;
a third thermal radiation sensing device disposed between the first heating source and the third heating source, the third thermal radiation sensing device being oriented to measure thermal radiation from a third point on a frontside of the wafer on the susceptor, wherein the first point and the third point are disposed between a first heating zone and a second heating zone, wherein a third heating zone is adjacent to the second heating zone, wherein in a plan view, the first heating zone, the second heating zone, and the third heating zone comprise concentric rectangles within the growth chamber, and wherein a width of a portion of the second heating zone disposed between a first adjacent edge of the first heating zone and a second adjacent edge of the third heating zone is smaller than a width of the first heating zone, wherein the first adjacent edge and the second adjacent edge are parallel to each other; and
a first controller configured to adjust power outputs to the first heating source, the second heating source, the third heating source, and the fourth heating source based upon the measured thermal radiation by the first thermal radiation sensing device; and
a processing unit configured to assume that a first temperature of the first point and a second temperature of the third point are the same and estimate a real-time thickness of an epitaxial film growing at the third point on the frontside of the wafer.

16. The apparatus of claim 15, wherein the second heating source is disposed vertically below the first heating source, and the fourth heating source is disposed vertically below the third heating source.

17. The apparatus of claim 15, wherein the first thermal radiation sensing device detects the thermal radiation from the first point on the backside of the wafer through a quartz windows in the susceptor.

18. The apparatus of claim 15, wherein the growth chamber comprises:
an upper portion; and
a lower portion, wherein the first heating source and the third heating source are disposed above a top surface of the upper portion, wherein the second heating source and the fourth heating source are disposed below a bottom surface of the lower portion, and walls of the upper portion and the lower portion comprise quartz.

19. The apparatus of claim 15, further comprising a second controller configured to adjust a flow rate of one or more precursors injected into the growth chamber based upon the measured thermal radiation by the first thermal radiation sensing device and the third thermal radiation sensing device.

20. The apparatus of claim 15, wherein the first thermal radiation sensing device and the third thermal radiation sensing device are capable of detecting thermal radiation having wavelengths that are in a range from 0.9 um to 1.6 um.

* * * * *